United States Patent
Teh et al.

(10) Patent No.: US 9,520,376 B2
(45) Date of Patent: Dec. 13, 2016

(54) BUMPLESS BUILD-UP LAYER PACKAGE INCLUDING AN INTEGRATED HEAT SPREADER

(71) Applicant: Intel Corporation, Santa Clara, CA (US)

(72) Inventors: Weng Hong Teh, Phoenix, AZ (US); Deepak Kulkarni, Chandler, AZ (US); Chia-Pin Chiu, Tempe, AZ (US); Tannaz Harirchian, Chandler, AZ (US); John S. Guzek, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/875,247

(22) Filed: Oct. 5, 2015

(65) Prior Publication Data

US 2016/0027757 A1    Jan. 28, 2016

Related U.S. Application Data

(60) Continuation of application No. 14/570,785, filed on Dec. 15, 2014, now Pat. No. 9,153,552, which is a
(Continued)

(51) Int. Cl.
*H01L 23/28* (2006.01)
*H01L 23/00* (2006.01)
(Continued)

(52) U.S. Cl.
CPC ............. *H01L 24/20* (2013.01); *H01L 21/56* (2013.01); *H01L 23/34* (2013.01); *H01L 23/36* (2013.01);
(Continued)

(58) Field of Classification Search
CPC ........ H01L 24/20; H01L 23/34; H01L 23/367; H01L 23/3677; H01L 23/4334; H01L 23/5389; H01L 25/18
(Continued)

(56) References Cited

U.S. PATENT DOCUMENTS 5,102,829 A    4/1992  Cohn
5,111,278 A    5/1992  Eichelberger
(Continued)

FOREIGN PATENT DOCUMENTS

DE    112013000494 T5    10/2014
WO    WO-0215266 A2    2/2002
WO    WO-2014051714 A1    4/2014

OTHER PUBLICATIONS

"U.S. Appl. No. 13/630,297, Response filed Nov. 12, 2014 to Restriction Requirement mailed Sep. 12, 2014", 9 pgs.
(Continued)

*Primary Examiner* — Nitin Parekh
(74) *Attorney, Agent, or Firm* — Schwegman Lundberg & Woessner, P.A.

(57) ABSTRACT

An example includes a die package including a microelectronic die having a lower die surface, an upper die surface parallel to the lower die surface, and a die side, the microelectronic die including an active region and an inactive region. The example optionally includes a heat spreader having a lower heat spreader surface, an upper heat spreader surface parallel to the lower heat spreader surface, and at least one heat spreader side, the heat spreader disposed on the upper surface of the microelectronic die in thermal communication with the inactive region of the die and electrically insulated from the active region. The example optionally includes an encapsulation material encapsulating the die side and the heat spreader side and lower heat spreader surface, the encapsulation material including a
(Continued)

US 9,520,376 B2

Page 2 lower surface substantially parallel to the die lower surface and an upper surface substantially parallel to the die upper surface.

7 Claims, 10 Drawing Sheets

Related U.S. Application Data division of application No. 13/631,205, filed on Sep. 28, 2012, now Pat. No. 8,912,670.

(51) Int. Cl.
| | |
|---|---|
| H01L 23/367 | (2006.01) |
| H01L 23/433 | (2006.01) |
| H01L 23/498 | (2006.01) |
| H01L 23/538 | (2006.01) |
| H01L 23/36 | (2006.01) |
| H01L 21/56 | (2006.01) |
| H01L 23/34 | (2006.01) |
| H01L 25/18 | (2006.01) |

(52) U.S. Cl.
CPC ......... *H01L 23/367* (2013.01); *H01L 23/3677* (2013.01); *H01L 23/4334* (2013.01); *H01L 23/49822* (2013.01); *H01L 23/5389* (2013.01); *H01L 24/19* (2013.01); *H01L 25/18* (2013.01); *H01L 2224/04105* (2013.01); *H01L 2224/16145* (2013.01); *H01L 2224/211* (2013.01); *H01L 2224/32245* (2013.01); *H01L 2224/73203* (2013.01); *H01L 2224/73259* (2013.01); *H01L 2224/73267* (2013.01); *H01L 2924/10253* (2013.01); *H01L 2924/15747* (2013.01)

(58) Field of Classification Search
USPC .......................................... 257/707, 713, 796
See application file for complete search history.

(56) References Cited

U.S. PATENT DOCUMENTS

| | | | | |
|---|---|---|---|---|
| 5,285,352 A * | 2/1994 | Pastore | ................... | H01L 23/36 |
| | | | | 165/185 |
| 5,287,247 A * | 2/1994 | Smits | ................... | H01L 23/3121 |
| | | | | 257/720 |
| 5,497,033 A | 3/1996 | Fillion et al. | | |
| 5,703,400 A | 12/1997 | Wojnarowski et al. | | |
| 5,745,984 A | 5/1998 | Cole, Jr. et al. | | |
| 5,761,044 A * | 6/1998 | Nakajima | ........... | H01L 23/3675 |
| | | | | 174/16.3 |
| 5,903,052 A * | 5/1999 | Chen | ....................... | H01L 23/24 |
| | | | | 257/706 |
| 6,011,694 A * | 1/2000 | Hirakawa | ........... | H01L 23/3128 |
| | | | | 174/16.3 |
| 6,084,297 A * | 7/2000 | Brooks | ................... | H01L 23/04 |
| | | | | 257/678 |
| 6,150,716 A * | 11/2000 | MacQuarrie | ......... | H01L 21/563 |
| | | | | 257/696 |
| 6,154,366 A | 11/2000 | Ma et al. | | |
| 6,271,469 B1 | 8/2001 | Ma et al. | | |
| 6,495,914 B1 | 12/2002 | Sekine et al. | | |
| 6,506,632 B1 | 1/2003 | Cheng et al. | | |
| 6,545,351 B1 * | 4/2003 | Jamieson | ............ | H01L 23/3128 |
| | | | | 257/668 |
| 6,969,640 B1 * | 11/2005 | Dimaano, Jr. | ........ | H01L 21/565 |
| | | | | 257/E21.504 |
| 7,042,081 B2 | 5/2006 | Wakisaka et al. | | |
| 7,189,596 B1 | 3/2007 | Mu | | |
| 7,659,143 B2 | 2/2010 | Tang et al. | | |
| 7,777,351 B1 | 8/2010 | Berry et al. | | |
| 7,851,894 B1 | 12/2010 | Scanlan | | |
| 7,851,905 B2 | 12/2010 | Chrysler et al. | | |
| 8,018,072 B1 * | 9/2011 | Miks | ................... | H01L 23/4334 |
| | | | | 257/667 |
| 8,064,224 B2 | 11/2011 | Mahajan et al. | | |
| 8,093,704 B2 | 1/2012 | Palmer et al. | | |
| 8,227,904 B2 | 7/2012 | Braunisch et al. | | |
| 8,319,338 B1 | 11/2012 | Berry et al. | | |
| 8,482,111 B2 | 7/2013 | Haba | | |
| 8,823,158 B2 | 9/2014 | Oh et al. | | |
| 8,883,563 B1 | 11/2014 | Haba et al. | | |
| 8,912,670 B2 | 12/2014 | Teh et al. | | |
| 9,153,552 B2 | 10/2015 | Teh et al. | | |
| 2002/0070443 A1 | 6/2002 | Mu et al. | | |
| 2003/0144405 A1 | 7/2003 | Lewin et al. | | |
| 2003/0222344 A1 | 12/2003 | Hosoyamada et al. | | |
| 2005/0098891 A1 | 5/2005 | Wakabayashi et al. | | |
| 2005/0230835 A1 | 10/2005 | Sunohara et al. | | |
| 2006/0038278 A1 * | 2/2006 | Wang | ...................... | H01L 23/13 |
| | | | | 257/698 |
| 2006/0097379 A1 | 5/2006 | Wang | | |
| 2007/0114677 A1 * | 5/2007 | Kwon | ................. | H01L 21/4871 |
| | | | | 257/796 |
| 2007/0148819 A1 | 6/2007 | Haba et al. | | |
| 2007/0205496 A1 | 9/2007 | Haba et al. | | |
| 2008/0054448 A1 | 3/2008 | Lu et al. | | |
| 2008/0315398 A1 | 12/2008 | Lo et al. | | |
| 2009/0045524 A1 | 2/2009 | Mohammed et al. | | |
| 2010/0072598 A1 | 3/2010 | Oh et al. | | |
| 2013/0249116 A1 | 9/2013 | Mohammed et al. | | |
| 2014/0091445 A1 | 4/2014 | Teh et al. | | |
| 2014/0091474 A1 | 4/2014 | Starkston et al. | | |
| 2014/0332946 A1 | 11/2014 | Oh et al. | | |
| 2015/0104907 A1 | 4/2015 | Teh et al. | | |

OTHER PUBLICATIONS

"U.S. Appl. No. 13/630,297, Restriction Requirement mailed Sep. 12, 2014", 7 pgs.
"U.S. Appl. No. 13/631,205, Notice of Allowance mailed Aug. 1, 2014", 11 pgs.
"U.S. Appl. No. 13/631,205, Preliminary Amendment filed Dec. 12, 2012", 3 pgs.
"U.S. Appl. No. 13/631,205, Response filed Jun. 30, 2014 to Restriction Requirement mailed Apr. 29, 2014", 6 pgs.
"U.S. Appl. No. 13/631,205, Restriction Requirement mailed Apr. 29, 2014", 6 pgs.
"U.S. Appl. No. 14/036,755, Non Final Office Action mailed Dec. 5, 2014", 16 pgs.
"U.S. Appl. No. 14/036,755, Response filed Sep. 17, 2014 to Restriction Requirement mailed Jul. 17, 2014", 7 pgs.
"U.S. Appl. No. 14/036,755, Restriction Requirement mailed Jul. 17, 2014", 6 pgs.
"U.S. Appl. No. 14/570,785, Non Final Office Action mailed Feb. 26, 2015", 7 pgs.
"U.S. Appl. No. 14/570,785, Notice of Allowance mailed May 28, 2015", 8 pgs.
"U.S. Appl. No. 14/570,785, Response May 14, 2015 to Non Final Office Action mailed Feb. 26, 2015", 5 pgs.
"International Application Serial No. PCT/US2013/044001, International Search Report mailed Aug. 27, 2013", 3 pgs.
"International Application Serial No. PCT/US2013/044001, Written Opinion mailed Aug. 27, 2013", 6 pgs.
Braunisch, Henning, et al., "High-speed performance of Silicon Bridge die-to-die interconnects", Electrical Performance of Electronic Packaging and Systems (EPEPS), IEEE 20th Conference, (Oct. 23, 2011), 95-98.
Kumagai, K, et al., "A silicon interposer BGA package with Cu-filled TSV and multi-layer Cu-plating interconnect", Proc. IEEE Electronic Components and Technol. Conf. (ECTC), Lake Buena Vista, FL, (May 27-30, 2008), 571-576.
Sunohara, M, et al., "Silicon Interposer with TSVs (through silicon vias) and fine multilayer wiring", Proc. IEEE Electronic Components and Technol. Conf. (ECTC), (May 27-30, 2008), 847-852.

(56) References Cited

OTHER PUBLICATIONS

Towle, Steven N., et al., "Bumpless Build-Up Layer Packaging", (2001), 7 pgs.

* cited by examiner

BUMPLESS BUILD-UP LAYER PACKAGE INCLUDING AN INTEGRATED HEAT SPREADER

PRIORITY APPLICATION

This application is a continuation of U.S. application Ser. No. 14/570,785, filed Dec. 15, 2014, which is a divisional of U.S. application Ser. No. 13/631,205, filed Sep. 28, 2012, issued as U.S. Pat. No. 8,912,670, all of which are incorporated herein by reference in their entirety.

TECHNICAL FIELD

Examples generally relate to the packaging of integrated circuits, and more specifically to a bumpless build-up layer package including an integrated heat spreader.

TECHNICAL BACKGROUND

Processors and other integrated circuit chips can generate significant heat. During miniaturization efforts, not only are circuits being crowded into smaller geometries, but multiple chips are also being crowded into smaller packages.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Examples in this disclosure relate to a process for forming a heat spreader integrated into a package that optionally includes bumpless build-up layers. Examples also relate to methods of assembling a bumpless build-up layer package including an integrated heat spreader.

The following description includes terms, such as upper, lower, first, second, etc. that are used for descriptive purposes only and are not to be construed as limiting. The examples of an apparatus or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer and wafers may be made of semiconducting, non-semiconducting, or combinations of semiconducting and non-semiconducting materials. A board is typically a resin-impregnated fiberglass structure acting as a mounting substrate for the die. A heat spreader in this disclosure is a thin structure that is integrated, including by being built-up into a package.

Reference will now be made to the drawings wherein like structures will be provided with like suffix reference designations. In order to show the structures of various examples clearly, the drawings included herein are diagrammatic representations of integrated circuit structures. Thus, the actual appearance of the fabricated structures, for example in a photomicrograph, may appear different while still incorporating subject matter of the illustrated examples. Moreover, the drawings show the structures to aid in understanding the illustrated examples.

Figure 1:
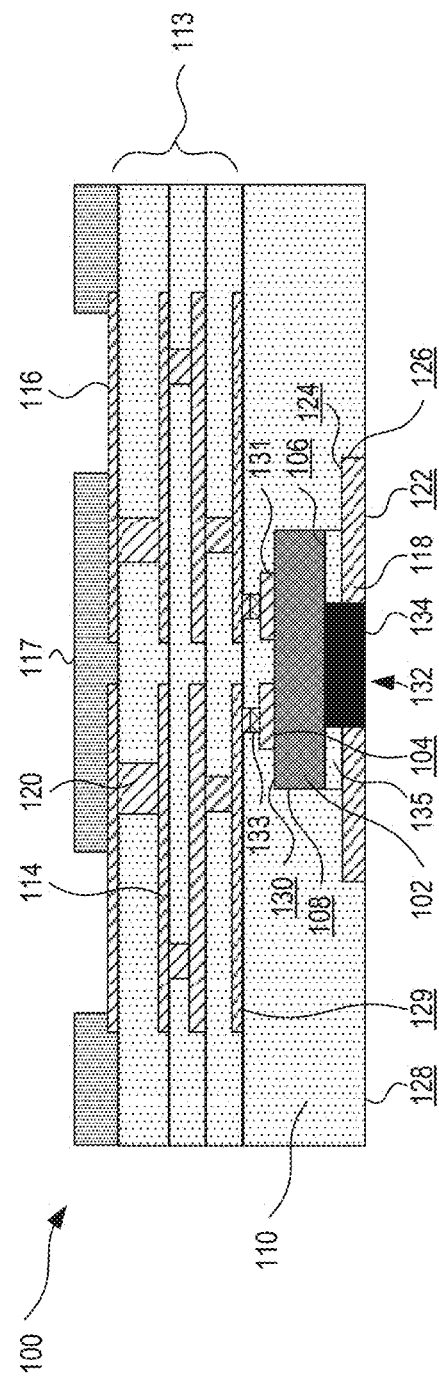
FIG. 1 illustrates a cross-section view of a packaged die including an integrated heat spreader, according to an example.

FIG. 1 illustrates a cross-section view of a packaged die 102 including an integrated heat spreader 118, according to an example. Microelectronic die 102 can be any type of integrated circuit die. The microelectronic die 102 can be a multi-core microprocessor. The package can be constructed as a bump-less build-up layer (BBUL) package.

The microelectronic die 102 can include an active region, which can include an active surface such as upper surface 104. The active region can extend to multiple sides of the die 102. The microelectronic die 102 can include an upper surface 104 which contains the electrical connections 131 to operate microelectronic die 102. Materials 133, such as build-up films, solder and the like can be used to connect the electrical connections 131 to conductive traces 114 as disclosed herein.

The die 102 can include a microelectronic die inactive region that can include an inactive surface such as lower surface 106. The inactive region can extend to multiple sides of the die 102. A lower surface 106 can be parallel to upper surface 104. The die 102 can include a die side 108. The die side 108 can extend between the upper surface 104 and the lower surface 106.

The package 100 can include encapsulation material 110. The package 100 can include build-up layers 113. The encapsulation material 110 can be formed of the same material as the build-up layers 113. One or more of the build-up layers or the encapsulation layer can be selected to have different materials to balance stresses that may occur due to stresses incurred in manufacturing or use.

The package 100 can include one or more conductive traces 114. The package can include conductive contacts 116. A mask 117 can define the contacts. The mask 117 can comprise a build-up layer. The package 100 can include one or more interconnects 120. Encapsulation material, as used herein, can include one or more build-up layers. In some examples, such as to reduce or control warpage, a thin layer of encapsulation material can be embedded within a build-up layer.

A heat spreader 118 can be integrated into the package 100. The heat spreader 118 can include a lower heat spreader surface 122. An upper heat spreader surface 124 can be parallel to the lower heat spreader surface 122. The heat spreader can include at least one heat spreader side 126. The heat spreader 118 can be disposed proximal the lower surface 106 of the microelectronic die 102. The heat spreader 118 can be in thermal communication with the die 102, such by contacting or being coupled to an inactive region of the die. The heat spreader 118 can comprise an electrically conductive material. The heat spreader 118 can be electrically insulated from the active region of the die 102.

The encapsulation material 110 can define a cavity between the heat spreader 118 and the microelectronic die 102. As illustrated, the heat spreader 118 can optionally define a heat spreader opening 132 with the lower surface of the die exposed through the heat spreader opening. The heat spreader opening 132 can open to the cavity, such as a cavity shaped to receive thermal interface material.

A thermal interface material 134 can be disposed between, and in thermal communication with, the upper heat spreader surface 124 and the lower die surface 106. The heat spreader 118 can define an opening 132 exposing at least a portion of the thermal interface material 134 to a lower surface 128 of the package 100.

The microelectronic die 102 can be held in place on at least one side 108 by encapsulation material 110. The die 102 can be coupled, such as through adhesion, such as onto a panel, such as the heat spreader 118, using an material having adhesive properties, such as die bonding film ("DBF") 135. The DBF can comprise a thermal interface material. The DBF can be disposed along the lower surface 106. The encapsulation material 110 can be to control package warpage, such as by selecting a material having a coefficient of thermal expansion selected to offset expansion or contraction of other materials proximal to the encapsulation material, such as the die 102.

The encapsulation material 110 can include a lower surface 128 that is substantially parallel to the die lower surface 106. The encapsulation material 110 can include an upper surface 130 that is substantially parallel to the die upper surface 104. The encapsulation material 110 can include at least one surface substantially planar to upper surface 104. There can be an opening in the encapsulation material 110 extending to a portion of the die, such as to the illustrated upper portion. The encapsulation material 110 can include at least one upper encapsulation material surface 129 substantially planar to lower surface 104. There can be an opening in the encapsulation material 110 extending to a portion of the die, such as to the illustrated lower portion. The upper surface 104 can be placed on a holding plate while encapsulation material 110 is disposed around microelectronic die 102. The encapsulation material 110 can encapsulate the die side 108 and the heat spreader side 126 and upper heat spreader surface 124.

Build-up layers 113 can be disposed on the encapsulation material 110. Encapsulation material 110 can be built up as are the build-up layers 113. Conductive traces 114 can be disposed on the build-up layers 113. The traces 114 and can be in electrical contact with upper surface 104. Conductive contacts 116 couple with conductive traces 114 and allow integrated circuit package 100 to be electrically coupled, for example by a socket connection, to a circuit board. In one example, conductive contacts 116 can include solder balls. Conductive contacts 116 can include lands or pins.

Figure 2A:
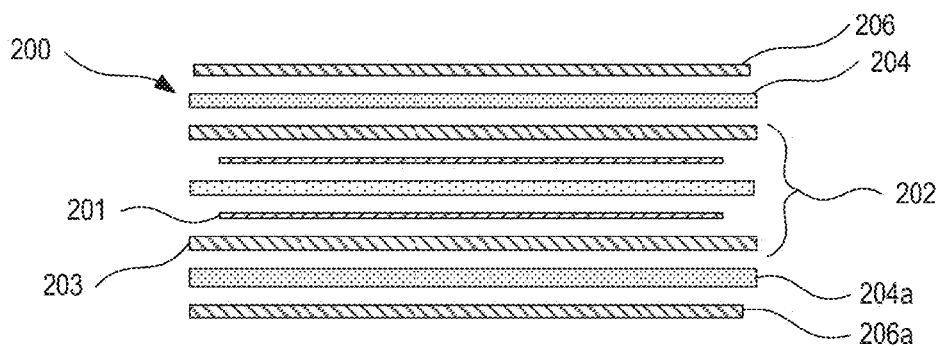
FIGS. 2A-H illustrate stages of a process for creating the packaged die of FIG. 1.
Figure 2B:
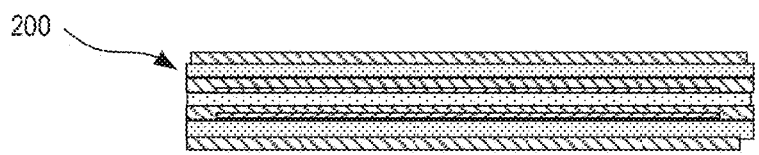
Figure 2C:
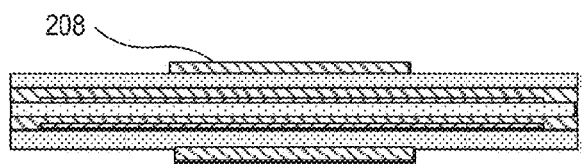
Figure 2D:
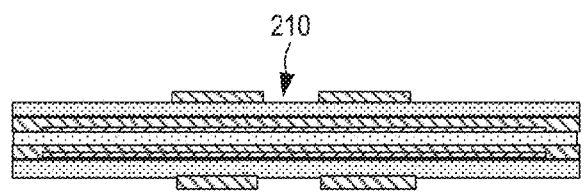

FIGS. 2A-H illustrate stages of a process for creating the packaged die of FIG. 1. FIG. 2A illustrates exploded layers 200, a coreless carrier 202, which can be provided as a panel, can be combined with etch stop layers 204 and a conductor 206, such as copper, to form a cavity, such as a cavity in which thermal interface material can be disposed. The coreless carrier can include a sacrificial short foil 201 and a sacrificial long foil 203. Examples of etch stop layers include, but are not limited to, a dielectric material such as a material having a low Young's Modulus, such as an Ajinomoto Build-up Film (ABF) dielectric material, including, but not limited to, GX-92, T-31 and other materials, each optionally combined with one or more fillers. One or more of these materials is manufactured by Ajinomoto Fine-Techno Co., Inc. FIG. 2B shows the elements of FIG. 2A assembled. FIG. 2C shows an assembly after patterning, such as subtractive patterning, is used to etch the copper 206 to form an integrated heat spreader 208. FIG. 2D shows a heat spreader that has been similarly etched to define an opening 210.

Figure 2E:
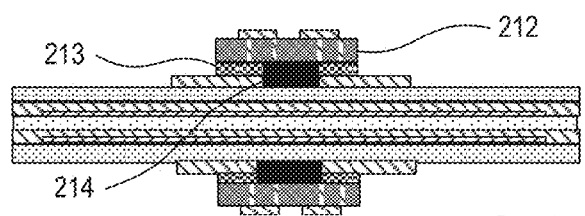

FIG. 2E illustrates a die 212 applied to the heat spreader. A thermal interface material 214 can be used to commute heat energy from the die 212 to the heat spreader 208. A die backing film 213 can optionally be used to adhere the die 212 to a heat spreader 208. The die backing film 213 can be a thermal interface material that conducts thermal energy. The thermal interface material can optionally be used to mechanically fix the die 212 to the heat spreader 208.

Figure 2F:
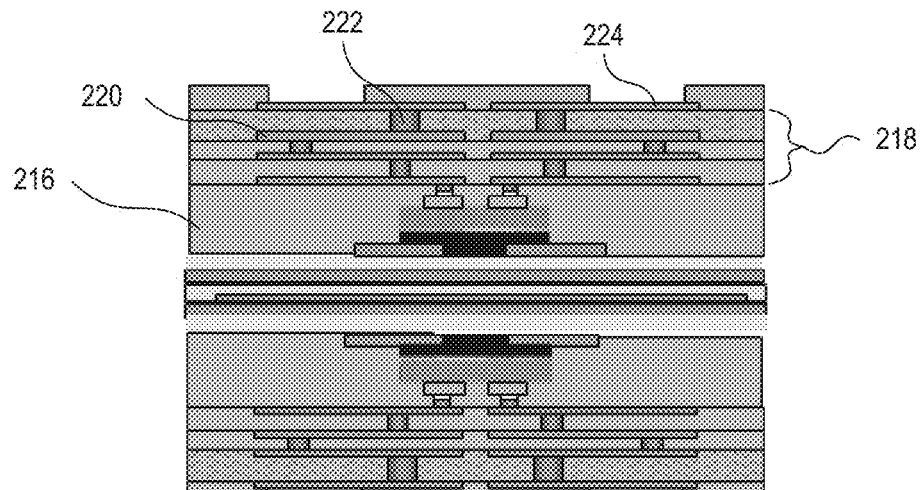

FIG. 2F shows a plurality of bumpless build-up layers (BBUL) 218 disposed onto encapsulation material 216. Although 3 layers are shown, other numbers of layers are possible. Conductive traces 220 can be formed onto the BBUL layers, as can the interconnects 222. Contacts 224 can be in electrical communication with the conductive traces 220. The contacts 224 can form a ball grid array.

Figure 2G:
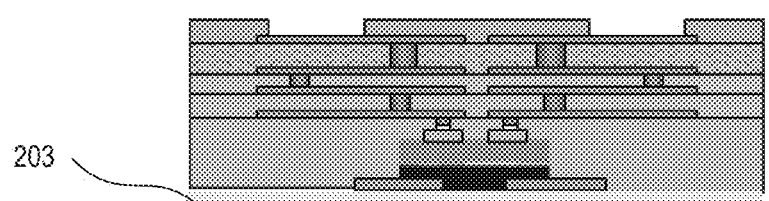
Figure 2H:
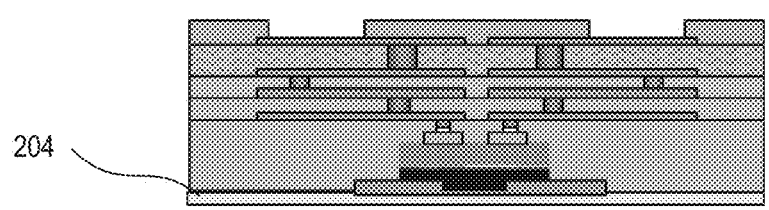

FIG. 2G shows a package after BBUL depaneling and routing of the short foil 201. An etch can be used to remove the long foil 203, stopping at the etch stop layer, as illustrated in FIG. 2H. Sandblasting can be used to remove the etch stop material 204, such as to provide the device illustrated in FIG. 1. The die is pictured showing a plurality of vias extending therethrough, but the present subject matter is not so limited. Such vias can improve thermal conductivity to one or both the heat spreader and the conductive traces, but are not necessary.

Figure 3A:
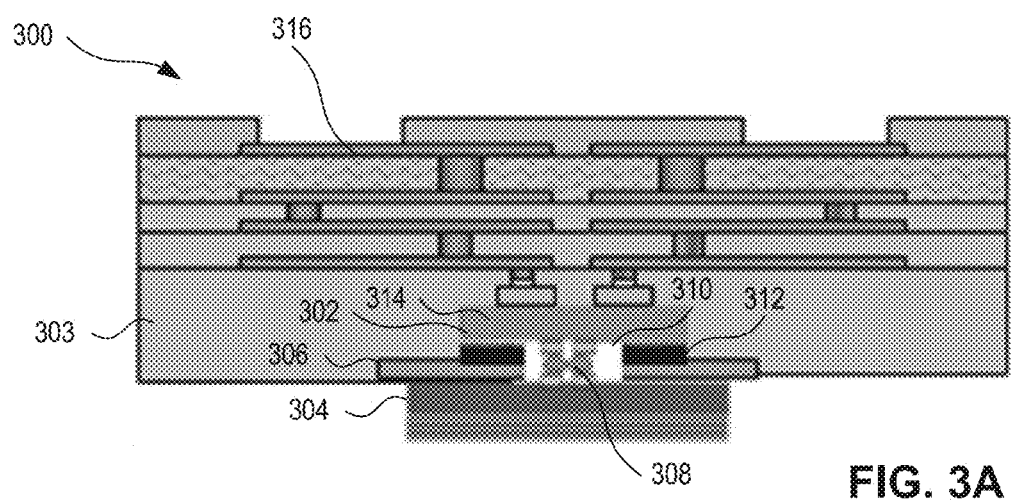
FIG. 3A illustrates a cross-section view of a packaged die including an integrated heat spreader, with a second die stacked onto the heat spreader, according to an example.
Figure 3B:
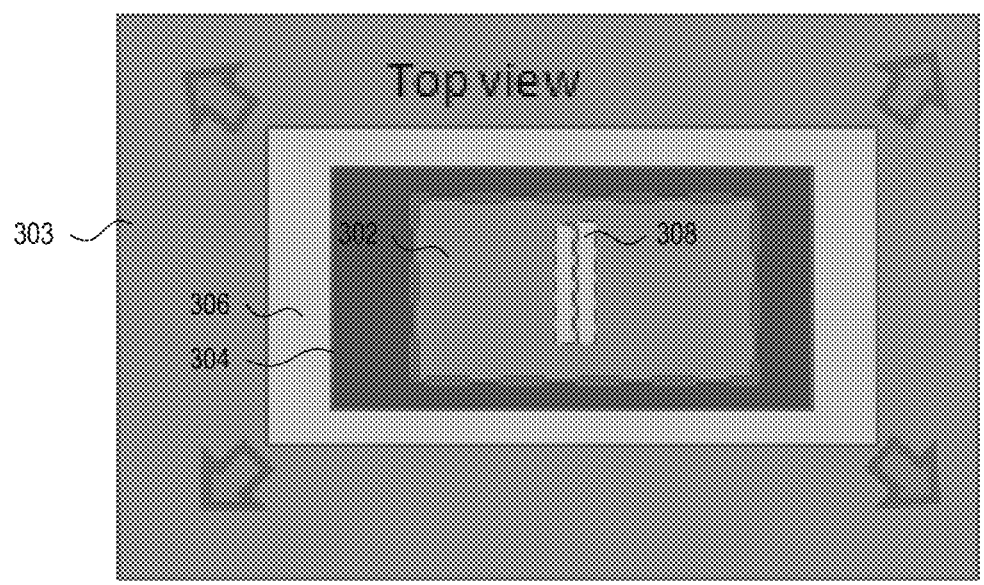
FIG. 3B illustrates a top view of the packaged die of FIG. 3A.

FIGS. 3A-B illustrate a cross-section view of packaged dies 300 including an integrated heat spreader 306, with a second die 304 stacked onto the heat spreader, according to an example. As described elsewhere, the first die 302 can be disposed in a BBUL package, including encapsulation material 303 encapsulating an integrated heat spreader 306. The second die 304 can be stacked in electrical communication with the first die 302, such as via conductors 308 passing through an opening 310 in the heat spreader 306 and the thermal interface material 312. Thus, the heat spreader 306 is sandwiched between the dice. The conductors 308 can comprise solder bumps, deformable interconnects, and the like. The first die 302 optionally includes vias 314, such as through-silicon vias. The vias 314 can place contacts 316 in electrical communication with an active portion of the second die, such as by passing signal information or supplying power through the vias. Arrows in FIG. 3B show directions in which the heat spreader 306 can optionally be expanded to dissipate more heat, and/or to be in thermal conductivity with another heat commuting device.

The first die and the second die can be each processors, such as a dual-core processing solution with two processors, manufactured by Intel Corporation of Santa Clara, Calif. Other integrated circuits are possible. The first die can be a memory, and the second die can be a processor, and vice versa.

Figure 4A:
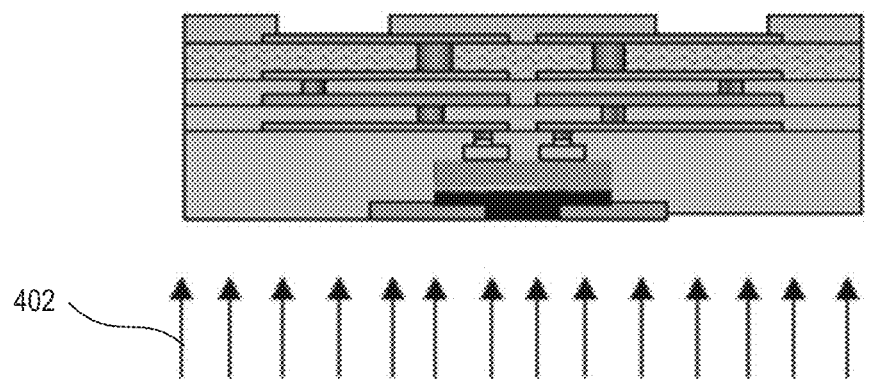
FIGS. 4A-B illustrate stages of a process for creating the packaged die of FIG. 3A.
Figure 4B:
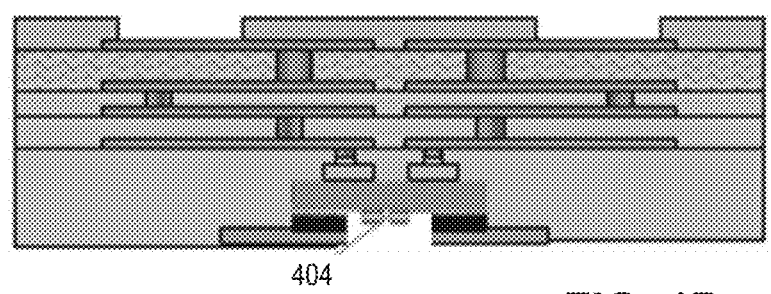

FIGS. 4A-B illustrate stages of a process for creating the packaged dies of FIG. 3A. A local thermal interface material removal process 402, such as a dry (e.g., plasma) or wet etch can be performed in-situ, patterned by the integrated heat spreader. Contacts 404 can be patterned onto the first die, such as to provide a logic-memory interface or a logic-logic interface.

Figure 5A:
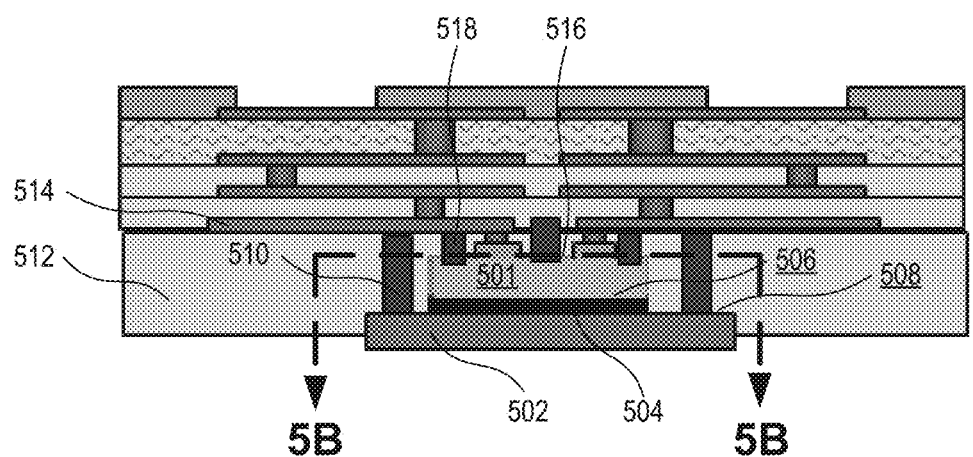
FIG. 5A illustrates a cross-section view of a packaged die including an integrated heat spreader and an integrated thermal conductor, according to an example.
Figure 5B:
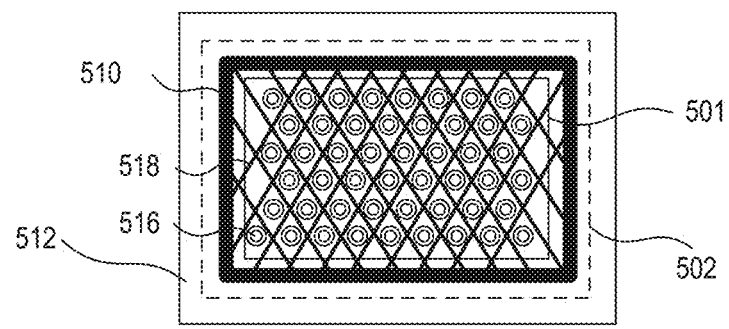
FIG. 5B illustrates a section view of the packaged die taken along line 5B-5B in FIG. 5A.

FIGS. 5A-B illustrate views of a packaged die including an integrated heat spreader and an integrated thermal conductor, according to an example. A heat spreader 502 can extend over the lower die surface 506. Thermal interface material 504 can extend between the lower die surface and the upper heat spreader surface 508. At least one thermal conductor 510 can be coupled in thermal communication to the upper heat spreader surface 508 and can extend through the encapsulation material 512. The thermal conductor 510 can be a via, in some examples. Such a via connection can represent a plated through hole formed by drilling a hole through the encapsulation material that can be then plated and filled. The thermal conductor can include a series of stacked microvias that can be formed within package core as part of a manufacturing process.

The at least one thermal conductor 510 can extend along a vertical length that can be parallel the die 501 side. At least one thermal conductor 510 can be coupled in thermal communication with a conductive trace 514 of the plurality of conductive traces. If a thermally conductive trace 514 is used for thermal communication, there can be a separate trace (e.g., on the same layer) for electrical conduction. The conductive trace 514 can be coupled in thermal communication with the die upper surface 516. The conductive trace can be in thermal communication with an inactive region of the die 501. The at least one thermal conductor 510 can define a circuit around the die 501, as illustrated in FIG. 5B.

A pattern such as a grid 518 of thermal conductors can be disposed between the conductive trace and the die upper surface, the grid interlaced around contacts 516 of the die and coupled in thermal communication with the at least one thermal conductor 510.

Figure 6A:
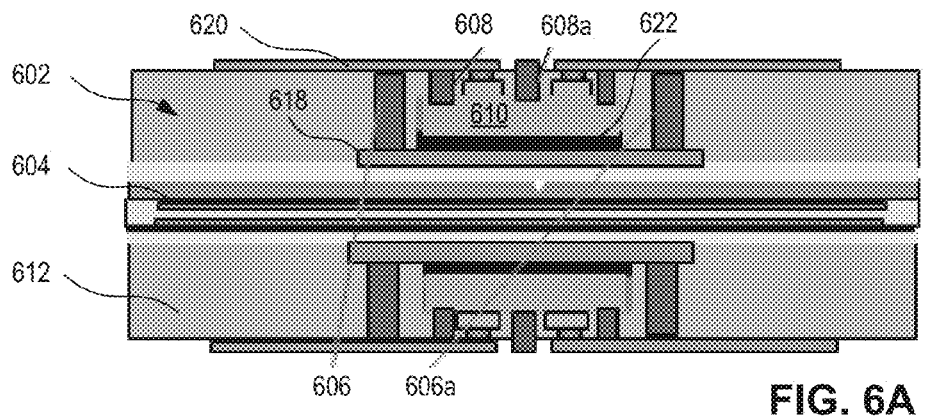
FIGS. 6A-B illustrate stages of a process for creating the packaged die of FIG. 5A.
Figure 6B:
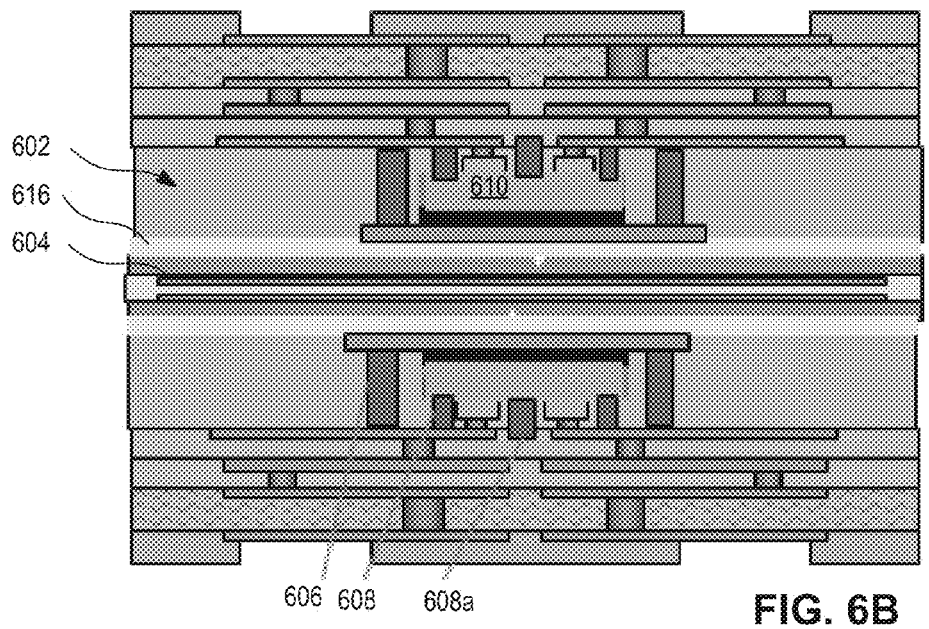

FIGS. 6A-B illustrate stages of a process for creating the packaged die of FIG. 5A. Portions of the process depicted in FIGS. 2A-E can be used to provide the device of FIG. 6A. Thermal conductors 608, which can comprise one or more thermal release vias, can be interlaced in an array, or inter-tier fine line pattered in a mesh on an active portion of a die, such as on one or more floating island contacts of the die 610. The array can be electrically isolated from the floating island contacts of the die 610. As discussed here, the array can provide a thermal path from the upper surface of the Si die and route them down to the heat spreader to allow heat to dissipate, such as to the environment. A portion 608a of the interlace can extend to a trace to commute thermal energy away from the die 610, optionally separate from a thermal conductive path through the thermal interface material 622, the heat spreader 618, the conductor 606 and the trace 620. Thermal conductors 606 can be built up as encapsulation material 612 is formed around the die 610. Additional layers can be built up after formation of the conductors 606, 608.

The device 602 can be depaneled and routed to provide the device of FIG. 5. Carrier 604, such as copper carrier, can be removed, and an etch stop 616 can be sandblasted away.

Figure 7A:
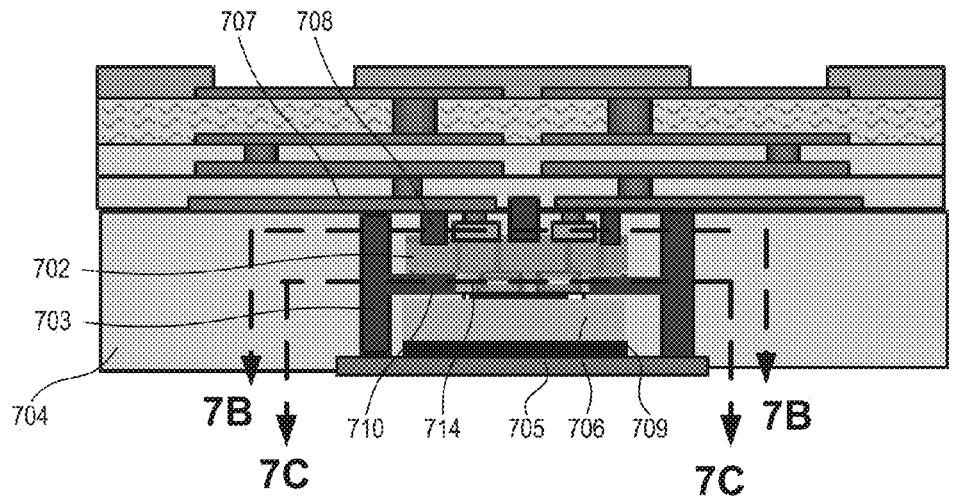
FIG. 7A illustrates a cross-section view of a packaged die including an integrated heat spreader and an integrated thermal conductor, according to an example.
Figure 7B:
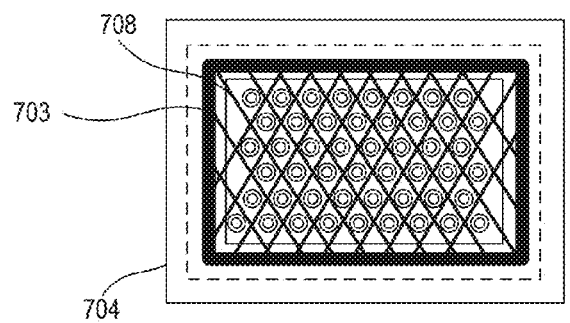
FIG. 7B illustrates a section view of the packaged die taken along line 7B-7B in FIG. 7A.
Figure 7C:
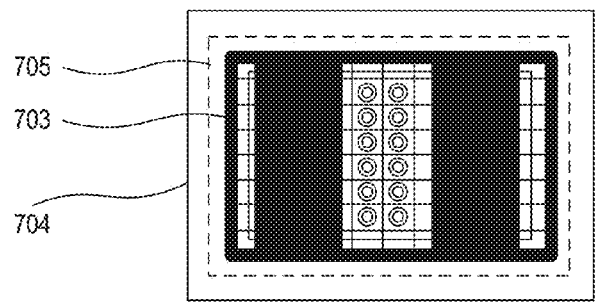
FIG. 7C illustrates a section view of the packaged die taken along line 7C-7C in FIG. 7A.

FIGS. 7A-C illustrate views of packaged dies including an integrated heat spreader 705 and an integrated thermal conductor 703, according to an example. A first die 706 is disposed in a BBUL package with the integrated heat spreader 705. Encapsulation material 704 can define an opening exposing a portion of the die 706, such as an active portion, or one or more vias extending through the die 706. The exposed portion can conduct thermal energy to the heat spreader 705, such as via thermal interface material 709.

A second die 702 can be stacked onto the microelectronic die 706, with each of them disposed above the heat spreader 705, and each encapsulated in the encapsulation material 704 along with the heat spreader. At least one electrical interconnect 714 can couple the microelectronic die 706 and second die 702 in electrical communication with one another. Encapsulation material 704 can define an opening exposing a portion of the die 702, such as an active portion, or one or more vias extending through the die 702.

Such a configuration can generate high levels of heat. Accordingly, a first grid 708 or interlaced thermal conductor can be disposed between the second die 702 and conductive traces 707, as in FIGS. 6A-B. The first grid 708 can conduct heat from the second die 702 to the conductive traces 707 and to a thermal conductor 703.

To better remove heat from the package, a second grid 710 can be disposed between the microelectronic die 706 and the second die 702. The second grid 710 can be interlaced around contacts between the microelectronic die and the second die and coupled in thermal communication with the at least one thermal conductor 703. As illustrated in FIG. 7C, portions of the second grid can be larger if fewer contacts extend between the dice than between the second die 702 and the conductive traces 707. For example, logic-memory interfaces utilize a relatively smaller number of electrical contacts, allowing for the second gird to comprise a large heat spreader circuit surrounding the dice interconnects.

The thermal conductor 703 can comprise a via connection extending through the encapsulation material. The thermal conductor 703 can comprise an electrically conductive connection through encapsulation material substantially parallel to a side of the die 706. The thermal conductor can include a series of stacked microvias that can be formed within package core as part of a manufacturing process.

The microelectronic die 706 can comprise a memory device, and the second die 702 can comprise a processor. In an example, the first die and the second die can be each processors, such as a dual-core processing solution with two processors, manufactured by Intel Corporation of Santa Clara, Calif.

Figure 8:
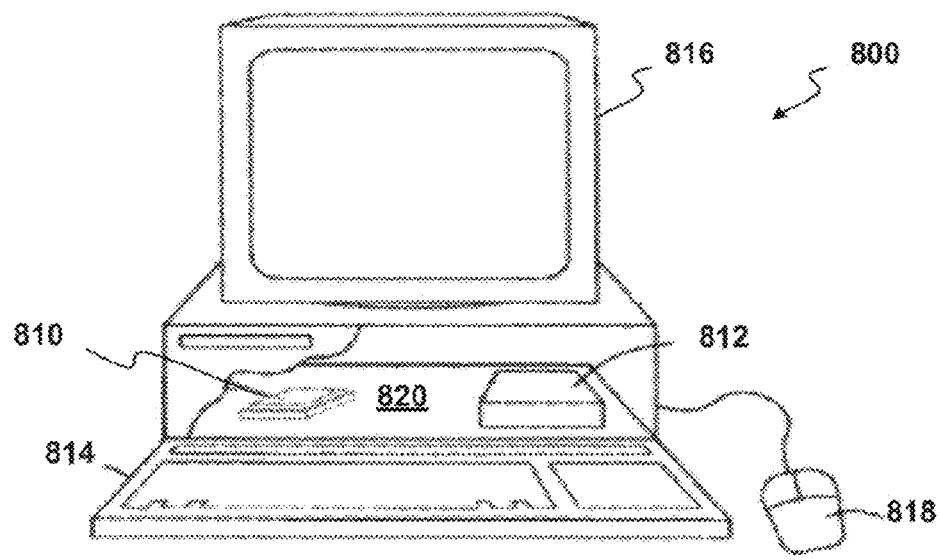
FIG. 8 is a cut-away elevation that depicts a computing system 800 according to an example.

FIG. 8 depicts a computing system 800 according to an example. One or more of the foregoing examples of integrated heat spreader assemblies, such as those manufactured according to a foregoing process, may be utilized in a computing system, such as computing system 800 of FIG. 8. An integrated heat spreader assembly manufactured according to a method embodiment alone or in combination with any other embodiment can be referred to as an example(s) configuration.

The computing system 800 can include processor, which can be enclosed in an IC chip package 810, a data storage system 812, input device such as a keyboard 814, and output device such as a monitor 816. The computing system 800 can include a processor that processes data signals and may include, for example, a microprocessor available from Intel Corporation. In addition to the keyboard 814, the computing system 800 can include another user input device such as a mouse 818.

The computing system 800 embodying components in accordance with the claimed subject matter can include any system that utilizes a microelectronic device system, which may include, for example, the integrated heat spreader assemblies described above, such as those manufactured according to a method example, which can be coupled to data storage such as dynamic random access memory (DRAM), polymer memory, flash memory, and phase-change memory. Certain example(s) can be coupled to any combination of these by being coupled to a processor. Data storage can include an embedded DRAM cache on a die. Example(s) configuration coupled to the processor can be part of a system with an example(s) configuration coupled to the data storage of the DRAM cache. Example(s) configuration can be coupled to the data storage system 812.

In an example, the computing system 800 can also include a die that contains a digital signal processor (DSP), a micro controller, an application specific integrated circuit (ASIC), or a microprocessor. An example(s) configuration can be coupled to any combination of these by being coupled to a processor. For an example, a DSP can be part of a chipset that can include a stand-alone processor and the DSP as separate parts of the chipset on a board 820. An example(s) configuration can be coupled to the DSP and a separate example(s) configuration may be present that can be coupled to the processor in the IC chip package 810. Additionally in an example, an example(s) configuration can be coupled to a DSP that can be mounted on the same board 820 as the IC chip package 810. An example(s) configuration can be combined as set forth with respect to the computing system 800, in combination with an example(s) configuration as set forth by the various examples of the integrated heat spreader assemblies manufactured according to a method example within this disclosure and their equivalents.

Examples set forth in this disclosure can be applied to devices and apparatuses other than a traditional computer. For example, a die can be packaged with an example(s) configuration and placed in a portable device such as a wireless communicator or a hand-held device such as a smart phone, a personal data assistant and the like. Another example can be a die that can be packaged with an example(s) configuration and placed in a vehicle such as an automobile, a locomotive, a watercraft, an aircraft, or a spacecraft.

Figure 9:
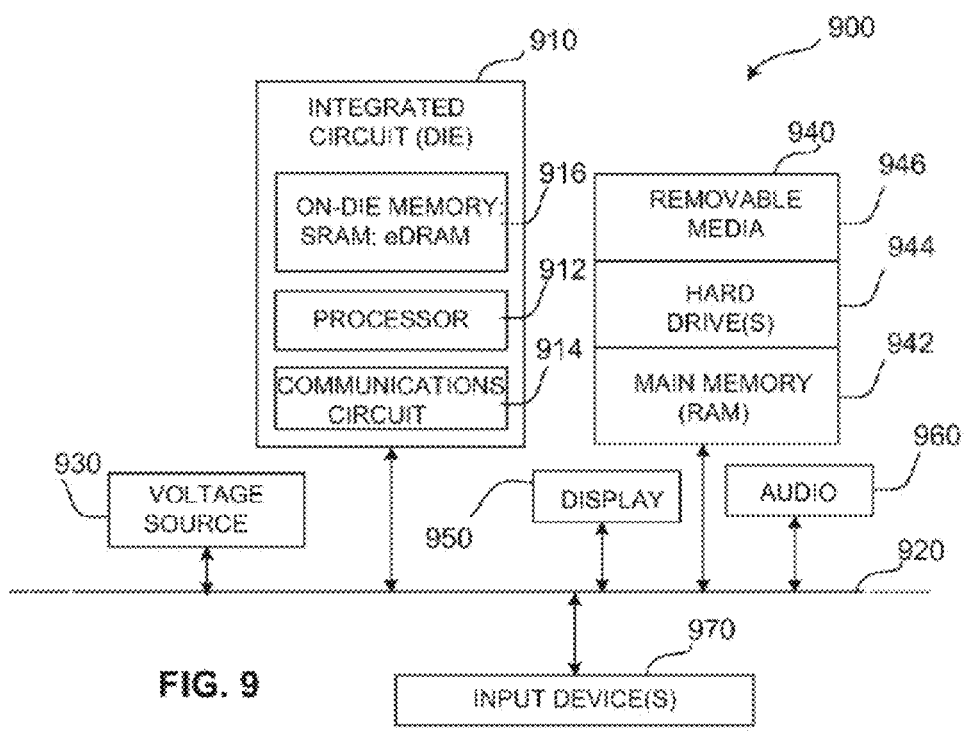
FIG. 9 is a schematic of an electronic system 900 according to an example.

FIG. 9 is a schematic of an electronic system 900 according to an example. The electronic system 900 as depicted can embody the computing system 800 depicted in FIG. 8, with the electronic system can be depicted schematically. The electronic system 900 incorporates electronic assembly 910, such as an IC die illustrated above. In an example, the electronic system 900 can be a computer system that can include a system bus 920 to electrically couple the various components of the electronic system 900. The system bus 920 can be a single bus or any combination of busses according to various examples. The electronic system 900 can include a voltage source 930 that provides power to the integrated circuit 910. In some examples, the voltage source 930 supplies current to the integrated circuit 910 through the system bus 920.

The integrated circuit 910 is electrically coupled to the system bus 920 and includes any circuit or combination of circuits according to an example. In an example, the integrated circuit 910 includes a processor 912 that can be of any type. As used herein, the processor 912 means any type of circuit such as, but not limited to, a microprocessor, a microcontroller, a graphics processor, a digital signal processor, or another processor. Accordingly, an integrated heat spreader assembly can be part of the electronic system that seats two dice, such as a processor first die and a second die selected from a processor or another die that is part of a chipset. Other types of circuits that can be included in the integrated circuit 910 are a custom circuit or an ASIC, such as a communications circuit 914 for use in wireless devices such as cellular telephones, pagers, portable computers, two-way radios, and similar electronic systems. In an example, the integrated circuit 910 includes on-die memory 916 such as static random-access memory (SRAM). In an example, the integrated circuit 910 includes on-die memory 916 such as embedded dynamic random-access memory (eDRAM).

In an example, the electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital video disks (DVDs), flash memory keys, and other removable media known in the art.

In an example, the electronic system 900 also includes a display device 950 and an audio output 960. In an example, the electronic system 900 includes an input 970, such as a keyboard, mouse, trackball, game controller, microphone, voice-recognition device, or any other device that inputs information into the electronic system 900.

As shown herein, integrated circuit 910 can be implemented in a number of different examples, including an electronic package, an electronic system, a computer system, one or more methods of fabricating an integrated circuit, and one or more methods of fabricating an electronic assembly that includes the integrated heat spreader assemblies as set forth herein in the various examples and their art-recognized equivalents. The elements, materials, geometries, dimensions, and sequence of operations can all be varied to suit particular packaging requirements.

Figure 10:
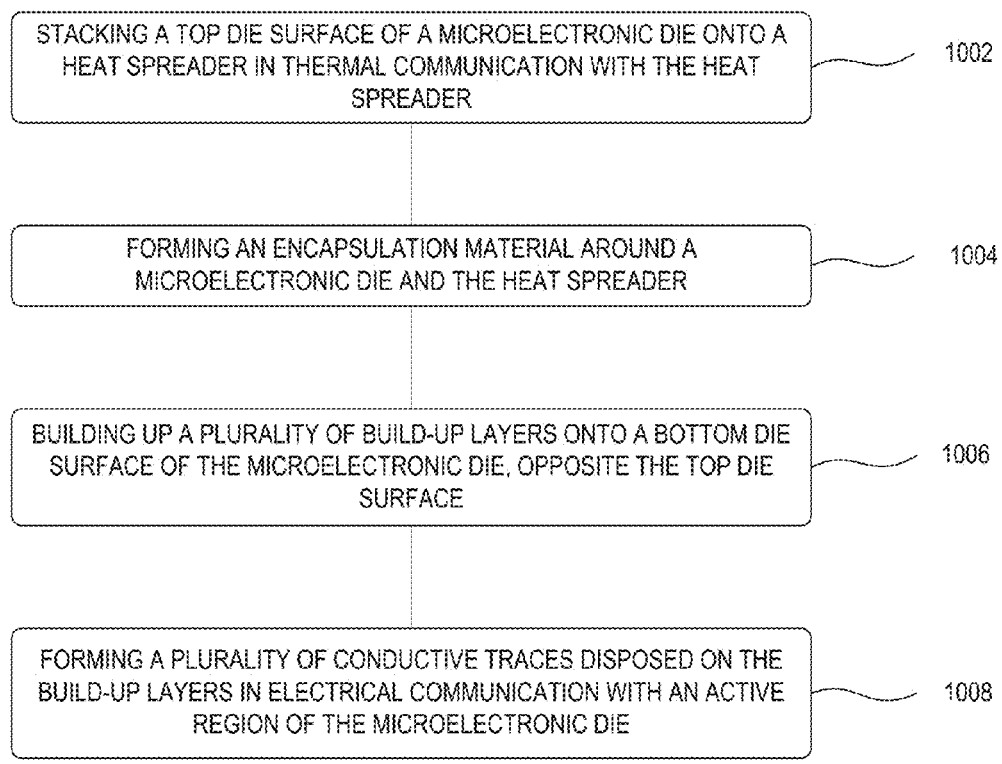
FIG. 10 is a flowchart showing a method of making a packaged die with an integrated heat spreader, according to an example.

FIG. 10 is a flowchart showing a method of making a packaged die with an integrated heat spreader, according to an example. The method can optionally include building up the plurality of build-up layers includes forming bumpless build-up layers (BBUL) in electrical communication with the die. At 1002 the method can include stacking a lower die surface of a microelectronic die onto a heat spreader in thermal communication with the heat spreader. At 1004, the method can include forming an encapsulation material around a microelectronic die and the heat spreader. At 1006, the method can include building up a plurality of build-up layers onto an upper die surface of the microelectronic die, opposite the lower die surface. At 1008, the method can include forming a plurality of conductive traces disposed on the build-up layers in electrical communication with an active region of the microelectronic die.

Optionally, the method can include forming the encapsulation material includes forming a cavity between the heat spreader and the microelectronic die. Optionally, the method can include disposing a thermal interface material between the lower die surface and the heat spreader, such as in the cavity. Optional methods are included in which the heat spreader defines an opening exposing at least a portion of the thermal interface material to a lower surface of the package.

Optionally, the method can include stacking a second die on the heat spreader, including electrically coupling the second die to the microelectronic die through the opening. Optionally, the method can include disposing a second die in the cavity.

The method can optionally include disposing an array of thermal conductors between the microelectronic die and the second die. Optionally, the method can include stacking a thermal conductor between the heat spreader and a conductive trace of the plurality of conductive traces.

EXAMPLES AND NOTES

Example 1 can include subject matter (such as a system, apparatus, method, tangible machine readable medium, etc.) that can include a die package. The die package can include a microelectronic die having an upper die surface, a lower die surface parallel to the upper die surface, and a die side, the microelectronic die including an active region and an inactive region. The example can include a heat spreader having an upper heat spreader surface, a lower heat spreader surface parallel to the upper heat spreader surface, and at least one heat spreader side, the heat spreader disposed on the lower surface of the microelectronic die in thermal communication with the inactive region of the die and electrically insulated from the active region of the microelectronic die. The example can include an encapsulation material encapsulating the die side and the heat spreader side and upper heat spreader surface, the encapsulation material including an upper surface substantially parallel to the die upper surface and a lower surface substantially parallel to the die lower surface. The example can include a plurality of build-up layers disposed on the upper surface of the encapsulation material. The example can include a plurality of conductive traces disposed on the build-up layers and in electrical communication with the active region.

Example 2 can include any of the preceding examples, wherein the encapsulation material defines a lower encapsulation material opening in the lower surface with the lower die surface exposed through the lower encapsulation material opening.

Example 3 can include any of the preceding examples, wherein the heat spreader defines a heat spreader opening in the lower surface with the lower die surface exposed through the heat spreader opening.

Example 4 can include any of the preceding examples, wherein a thermal interface material is disposed between, and in thermal communication with, the upper heat spreader surface and the lower die surface.

Example 5 can include any of the preceding examples, wherein the lower of the encapsulation material is substantially planar with a lower surface of the heat spreader and a lower surface of the thermal interface material.

Example 6 can include any of the preceding examples, wherein the heat spreader extends over the lower die surface, with thermal interface material extending between the lower die surface and the upper heat spreader surface.

Example 7 can include any of the preceding examples, wherein at least one thermal conductor is coupled in thermal communication to the upper heat spreader surface and extends through the encapsulation material, parallel the die side, and is coupled in thermal communication with a conductive trace of the plurality of conductive traces, the conductive trace being coupled in thermal communication with the die upper surface.

Example 8 can include any of the preceding examples, wherein the at least one thermal conductor forms a circuit around the microelectronic die.

Example 9 can include any of the preceding examples, wherein a grid of thermal conductors is disposed between the conductive trace and the die upper surface, the grid interlaced around contacts of the die and coupled in thermal communication with the at least one thermal conductor.

Example 10 can include any of the preceding examples, wherein a second die is disposed between the microelectronic die and the heat spreader, and a second grid is disposed between the microelectronic die and the second die, the second grid interlaced around contacts between the microelectronic die and the second die and coupled in thermal communication with the at least one thermal conductor.

Example 11 can include any of the preceding examples, wherein a through via connection extends through the microelectronic die from the die upper surface to the microelectronic die, electrically connecting the plurality of traces to the second die.

Example 12 can include any of the preceding examples, wherein the microelectronic die comprises a memory device, and the second die comprises a processor.

Example 13 can include any of the preceding examples, wherein the conductive trace is in thermal communication with an inactive region of the die.

Example 14 can include any of the preceding examples, wherein the lower die surface is an inactive surface.

Example 15 can include any of the preceding examples, wherein the upper die surface is an active surface.

Example 16 can include any of the preceding examples, wherein the heat spreader, the encapsulation material, the plurality of build-up layers and the plurality of conductive traces comprise a bumpless build-up layer package.

Example 17 can include subject matter (such as a system, apparatus, method, tangible machine readable medium, etc.) that can include forming a packaged microelectronic die. The example can include stacking a lower die surface of a microelectronic die onto a heat spreader in thermal communication with the heat spreader. The example can include forming an encapsulation material around a microelectronic die and the heat spreader. The example can include building up a plurality of build-up layers onto an upper die surface of the microelectronic die, opposite the lower die surface. The example can include forming a plurality of conductive traces disposed on the build-up layers in electrical communication with an active region of the microelectronic die. The example can include disposing a thermal interface material between the lower die surface and the heat spreader.

Example 18 can include any of the preceding examples, wherein the heat spreader defines an opening exposing at least a portion of the thermal interface material to a lower surface of the package.

Example 19 can include any of the preceding examples and also include stacking a second die on the heat spreader, including electrically coupling the second die to the microelectronic die through the opening.

Example 20 can include any of the preceding examples, wherein building up the plurality of build-up layers includes forming bumpless build-up layers (BBUL) in electrical communication with the die.

Example 21 can include any of the preceding examples, wherein forming the encapsulation material includes forming a cavity between the heat spreader and the microelectronic die.

Example 22 can include any of the preceding examples and also include disposing thermal interface material in the cavity.

Example 23 can include any of the preceding examples and also include disposing a second die in the cavity.

Example 24 can include any of the preceding examples and also include disposing an array of thermal conductors between the microelectronic die and the second die.

Example 25 can include any of the preceding examples and also include stacking a thermal conductor between the heat spreader and a conductive trace of the plurality of conductive traces Example 26 can include any of the preceding examples, wherein forming the encapsulation material includes forming a cavity between the heat spreader and the microelectronic die disposing.

Example 27 can include subject matter (such as a system, apparatus, method, tangible machine readable medium, etc.) that can include a microelectronic die having an upper die surface, a lower die surface parallel to the upper die surface, and a die side, the microelectronic die including an active region and an inactive region. The example can include a heat spreader having an upper heat spreader surface, a lower heat spreader surface parallel to the upper heat spreader surface, and at least one heat spreader side, the heat spreader disposed on the lower surface of the microelectronic die in thermal communication with the inactive region of the die and electrically insulated from the active region. The example can include an encapsulation material encapsulating the die side and the heat spreader side and upper heat spreader surface, the encapsulation material including an upper surface substantially parallel to the die upper surface and a lower surface substantially parallel to the die lower surface. The example can include a plurality of build-up layers disposed on the upper surface of the encapsulation material. The example can include a plurality of conductive traces disposed on the build-up layers and in electrical communication with the active region. The example can include dynamic random-access memory coupled to the microelectronic die.

Example 28 can include any of the preceding examples, wherein the encapsulation material defines a lower encapsulation material opening in the lower surface with the lower die surface exposed through the lower encapsulation material opening Example 29 can include any of the preceding examples, wherein the heat spreader defines a heat spreader opening in the lower surface with the lower die surface exposed through the lower encapsulation material opening Example 30 can include any of the preceding examples, wherein at least one electrical interconnect extends through the heat spreader opening and is coupled to through vias of the microelectronic die along the lower die surface, the electrical interconnects coupling a second die to the microelectronic die.

Example 31 can include any of the preceding examples, wherein the microelectronic die is a processor, and wherein the second die is selected from a data storage device, a digital signal processor, a micro controller, an application specific integrated circuit, and a processor.

Example 32 can include any of the preceding examples, wherein the example is disposed in one of a computer, a wireless communicator, a hand-held device, an automobile, a locomotive, an aircraft, a watercraft, and a spacecraft.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A microelectronic die assembly, comprising:
   a microelectronic die coupled to a plurality of build-up layers on a first side of the microelectronic die;
   a heat spreader thermally coupled to a second side of the microelectronic die, opposite the first side;
   an encapsulation material covering the microelectronic die and at least a portion of the heat spreader; and
   a grid of thermal conductors disposed between the plurality of build-up layers and the first side of the microelectronic die, the grid interlaced around a plurality of electrical contacts between die and the plurality of build-up layers.

2. The microelectronic die assembly of claim 1, wherein the grid of thermal conductors is thermally coupled to the heat spreader.

3. The microelectronic die assembly of claim 2, wherein the grid of thermal conductors is thermally coupled to the heat spreader using one or more plated and filled vias.

4. The microelectronic die assembly of claim 1, further including a second microelectronic die coupled between the heat spreader and the plurality of build-up layers.

5. The microelectronic die assembly of claim 4, further including a second grid of thermal conductors disposed between the microelectronic die and the second microelectronic die.

6. The microelectronic die assembly of claim 5, wherein the second grid of thermal conductors is thermally coupled to the heat spreader.

7. The microelectronic die assembly of claim 6, wherein the second grid of thermal conductors is thermally coupled to the heat spreader using one or more plated and filled vias.

\* \* \* \* \*